(12) United States Patent
Miyawaki

(10) Patent No.: US 7,300,836 B2
(45) Date of Patent: Nov. 27, 2007

(54) MANUFACTURING METHOD OF SEMICONDUCTOR DEVICE

(75) Inventor: Yoshihiko Miyawaki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 258 days.

(21) Appl. No.: 11/011,785

(22) Filed: Dec. 15, 2004

(65) Prior Publication Data
US 2005/0158943 A1 Jul. 21, 2005

(30) Foreign Application Priority Data
Dec. 25, 2003 (JP) ............... 2003-429823

(51) Int. Cl.
*H01L 21/8238* (2006.01)
(52) U.S. Cl. .............. 438/210; 438/238; 438/383
(58) Field of Classification Search ........... 438/210, 438/238, 382, 383, 384, 385, 329
See application file for complete search history.

(56) References Cited

U.S. PATENT DOCUMENTS

| | | | |
|---|---|---|---|
| 5,134,088 A * | 7/1992 | Zetterlund | 438/238 |
| 5,940,708 A | 8/1999 | Aoyama et al. | |
| 6,027,965 A * | 2/2000 | Stucchi et al. | 438/238 |
| 6,096,591 A * | 8/2000 | Gardner et al. | 438/238 |
| 6,300,181 B1 * | 10/2001 | Patelmo et al. | 438/210 |
| 6,869,839 B2 * | 3/2005 | Lee et al. | 438/238 |

FOREIGN PATENT DOCUMENTS

JP 09-045790 2/1997

* cited by examiner

*Primary Examiner*—Tuan H. Nguyen
(74) *Attorney, Agent, or Firm*—Morrison & Foerster LLP

(57) ABSTRACT

This invention is directed to a manufacturing method of a semiconductor device having a MOS transistor and a diffusion resistance layer formed on a same semiconductor substrate, where current leakage from the diffusion resistance layer is minimized. The manufacturing method of the semiconductor device of the invention has following features. That is, a CVD insulation film is formed on a whole surface of an n-type well including on a gate electrode and a p$^+$-type diffusion resistance layer formed thereon. Then, a second photoresist layer is formed having an opening above a part of the diffusion resistance layer. By using this second photoresist layer as a mask, an anisotropic etching is performed to the CVD insulation film to form a sidewall spacer on a sidewall of the gate electrode. Furthermore, by using the second photoresist layer as a mask, the p-type impurity of high concentration is doped to form a source layer and a drain layer of the MOS transistor and a contact forming p$^+$-type layer of the diffusion resistance layer.

3 Claims, 5 Drawing Sheets

MANUFACTURING METHOD OF SEMICONDUCTOR DEVICE

CROSS-REFERENCE OF THE INVENTION

This invention is based on Japanese Patent Application No. 2003-429823, the content of which is incorporated by reference in its entirety.

BACKGROUND OF THE INVENTION

1. Field of the Invention

This invention relates to a manufacturing method of a semiconductor device, particularly to a manufacturing method of the semiconductor device having a MOS transistor and a diffused resistor formed on a same semiconductor substrate.

2. Description of the Related Art

Bipolar ICs are a type of a semiconductor device used for a circuit of a receiver such as a television. The bipolar IC is a semiconductor device having a MOS transistor having a sidewall spacer formed on a sidewall of a gate electrode and a diffusion resistance layer formed by doping an impurity of low concentration on the same semiconductor substrate together with the bipolar transistor which is drivable with a large current. The diffusion resistance layer is used, for example, for generating a voltage drop necessary in the circuit.

Next, a manufacturing method of a semiconductor device of the related art applicable to the above bipolar IC will be described with reference to drawings. FIGS. 8 to 12 show the manufacturing method of the semiconductor device of the related art. FIGS. 8 to 12 show a cross-sectional view of a region formed with a MOS transistor 20 and a diffusion resistance layer 30 that is part of an electronic device including a bipolar transistor (not shown) formed on the same p-type semiconductor substrate 10.

First, as shown in FIG. 8, an n-type well 11 is formed on the p-type semiconductor substrate 10. In this n-type well 11, element separation layers 12 are formed around the region to be formed with the diffusion resistance layer 30 by a LOCOS (local oxidation of silicon) method. Then, a gate insulation film 21 (e.g. made of a silicon oxide film) is formed on the whole surface of the n-type well 11 except on the element separation layers 12.

Next, as shown in FIG. 9, a gate electrode 22 is formed on a part of the gate insulation film 21 in the position adjacent the region to be formed with the diffusion resistance layer 30. Then, a photoresist layer 40 having an opening 40m above the region to be formed with the diffusion resistance layer 30 is formed by exposure and development with a mask (not shown). By using this photoresist layer 40 as a mask, a p-type impurity (e.g. boron) of low concentration is doped in the n-type well 11 to form a p$^-$-type diffusion layer.

Next, as shown in FIG. 10, after the photoresist layer 40 is removed, a CVD insulation film 23 (e.g. made of a silicon oxide film) is formed on the whole surface by a CVD method.

Then, as shown in FIG. 11, an anisotropic etching is performed to the CVD insulation film 23 to form a sidewall spacer 23s on a sidewall of the gate electrode 22.

Then, as shown in FIG. 12, a p-type impurity of high concentration is selectively doped by using a mask (not shown) to form a source layer 24s and a drain layer 24d of the MOS transistor 20 and a contact forming p$^+$-type layer 31 for forming a contact of the diffusion resistance layer 30. The MOS transistor 20 and the diffusion resistance layer 30 are thus formed on the same p-type semiconductor substrate 10 by the manufacturing method described above. The related technology is disclosed in Japanese Patent No. 3143366.

However, in the manufacturing method of the semiconductor device of the related art, in the step of forming the sidewall spacer 23s by performing the anisotropic etching to the CVD insulation film 23, damages such as a crystal defect occur at the surface of the diffusion resistance layer 30 by over-etching. This generates property variation in the diffusion resistance layer 30, thereby degrading operation characteristics of the diffusion resistance layer 30.

That is, when the damages occur in the diffusion resistance layer 30, particularly, in a region around a border with the element separation layers 12, by over-etching, there arises a problem of generating many leak paths leaking a leak current to the n-type well 11 (shown by an arrow in FIG. 12). Particularly, when a bipolar transistor (not shown) formed on the same p-type semiconductor substrate 10 is driven for a long time, high Joule heat is generated and the diffusion resistance layer 30 formed on the same p-type semiconductor substrate 10 is overheated, thereby increasing a leak current more. This results in a problem of degrading the operation characteristics of the semiconductor device.

SUMMARY OF THE INVENTION

This invention is directed to a manufacturing method of a semiconductor device having a MOS transistor and a diffusion resistance layer formed on the same substrate where current leakage from the diffusion resistance layer is minimized.

The invention provides a method of manufacturing a semiconductor device including a MOS transistor and a diffusion resistance layer that are formed on the semiconductor substrate. The method includes forming an element separation layer on the semiconductor substrate, forming a gate electrode of the MOS transistor adjacent the element separation layer, forming the diffusion resistance layer by doping a low concentration of impurities in a region of the semiconductor substrate surrounded by the element separation layer, forming an insulation film to cover a top surface and a side wall of the gate electrode and to cover the diffusion resistance layer, forming an etching protection layer on the diffusion resistance layer so as to cover a portion of the diffusion resistance layer that is not subject to a further impurity doping and to expose a portion of the diffusion resistance layer that is subject to the further impurity doping, and forming a sidewall spacer on the sidewall of the gate electrode by performing an etching to the insulation film using the etching protection layer as a mask.

DETAILED DESCRIPTION OF THE INVENTION

A manufacturing method of a semiconductor device of an embodiment of the invention will be described with reference to drawings. The semiconductor device of this embodiment has a MOS transistor and a diffusion resistance layer formed on the same semiconductor substrate together with a bipolar transistor which is drivable with a large current and used for a circuit of a receiver such as a television. However, the semiconductor device of this embodiment is not limited to this, and other electronic devices can be formed on the same semiconductor substrate in addition to the bipolar transistor.

FIGS. 1 to 7 show the manufacturing method of the semiconductor device of this embodiment. FIGS. 1 to 7 show a cross-sectional view of a region to be formed with a pair of a MOS transistor 20 and a diffusion resistance layer 30 that is part of an electronic device including a bipolar transistor (not shown) to be formed on the same p-type semiconductor substrate 10. In this embodiment, the MOS transistor 20 is of a p-channel type, and the diffusion resistance layer 30 is formed of a p-type diffusion layer.

Figure 1:
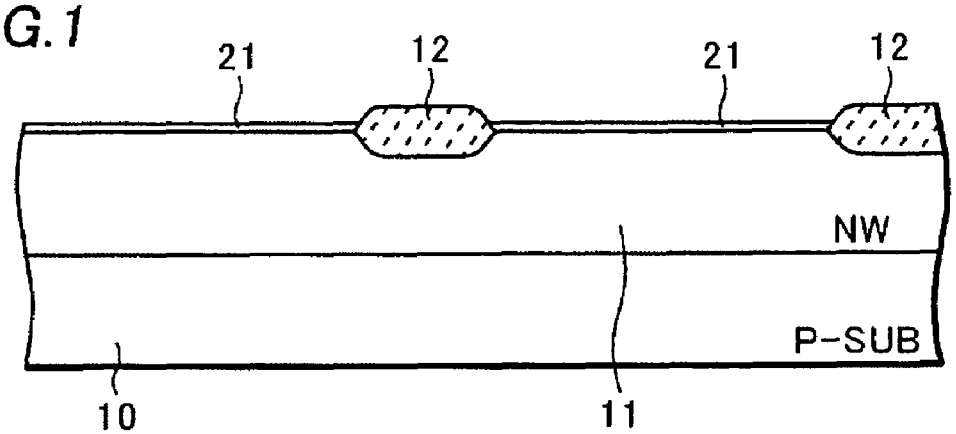
FIG. 1 is a view showing a step of a manufacturing method of a semiconductor device of an embodiment of the invention.

First, as shown in FIG. 1, an n-type well 11 is formed on a p-type semiconductor substrate 10. In the n-type well 11, element separation layers 12 are formed around a region to be formed with the diffusion resistance layer 30, for example, by a LOCOS (local oxidation of silicon) method. It is preferable that the element separation layer 12 has a film thickness of about 500 nm in this embodiment. Then, a gate insulation film 21 (e.g. made of a silicon oxide film) is formed on the whole surface of the n-type well 11 except on the element separation layers 12. It is preferable that the gate insulation film 21 has a film thickness of about 120 nm in this embodiment.

Figure 2:
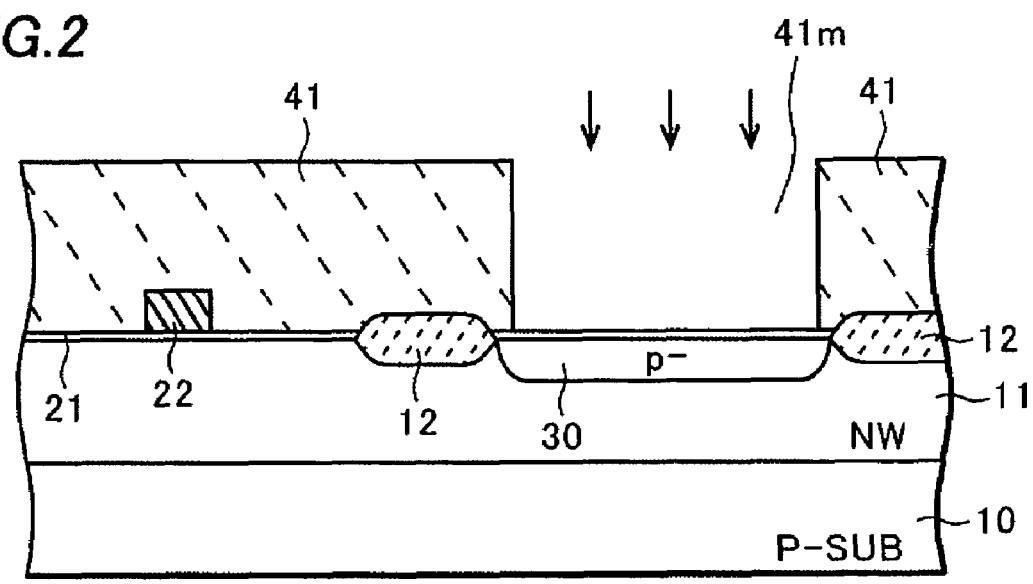
FIG. 2 shows a step after the step of FIG. 1 of the manufacturing method of the semiconductor device of the embodiment of the invention.

Next, as shown in FIG. 2, a gate electrode 22 is formed on a part of the gate insulation 20 film 21 in a position adjacent the region to be formed with the diffusion resistance layer 30. It is preferable that the gate electrode 22 has a film thickness of about 200 nm. This gate electrode 22 has a polycide structure formed of a silicide layer laminated on a polysilicon layer, for example, but can have a single-layered structure formed of a polysilicon layer or other structures.

Next, a first photoresist layer 41 having an opening 41$m$ above a region surrounded by the element separation layers 12, i.e., the region to be formed with the diffusion resistance layer 30, is formed above the n-type well 11 by exposure and development with a mask (not shown). Then, by using this first photoresist layer 41 as a mask, a p-type impurity of low concentration is doped, i.e., ion-injected, in the n-type well 11 to form a p$^-$-type diffusion layer in the region surrounded by the element separation layers 12 on the n-type well 11. This p$^-$-type diffusion layer is the diffusion resistance layer 30. It is preferable that the p-type impurity of low concentration is boron (B+), and its acceleration voltage and the doping amount are about 30 KeV and $6\times10^{12}$/cm$^2$, respectively.

Figure 3:
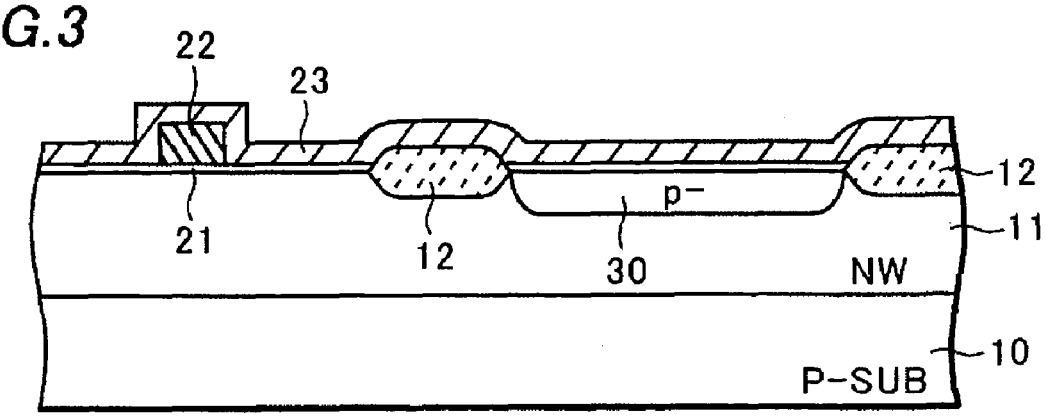
FIG. 3 shows a step after the step of FIG. 2 of the manufacturing method of the semiconductor device of the embodiment of the invention.

Next, as shown in FIG. 3, after the first photoresist layer 41 is removed, a CVD insulation film 23 made of, for example, a silicon oxide film is formed on the whole surface above the n-type well 11 including on the gate electrode 22 and above the diffusion resistance layer 30 by a CVD method. A part of this CVD insulation film 23 will become a sidewall spacer 23$s$ formed on a sidewall of the gate electrode 22 in a later process step. The material of the sidewall spacer 23$s$ is not limited to the silicon oxide film and can be formed of a silicon nitride film, for example.

Figure 4:
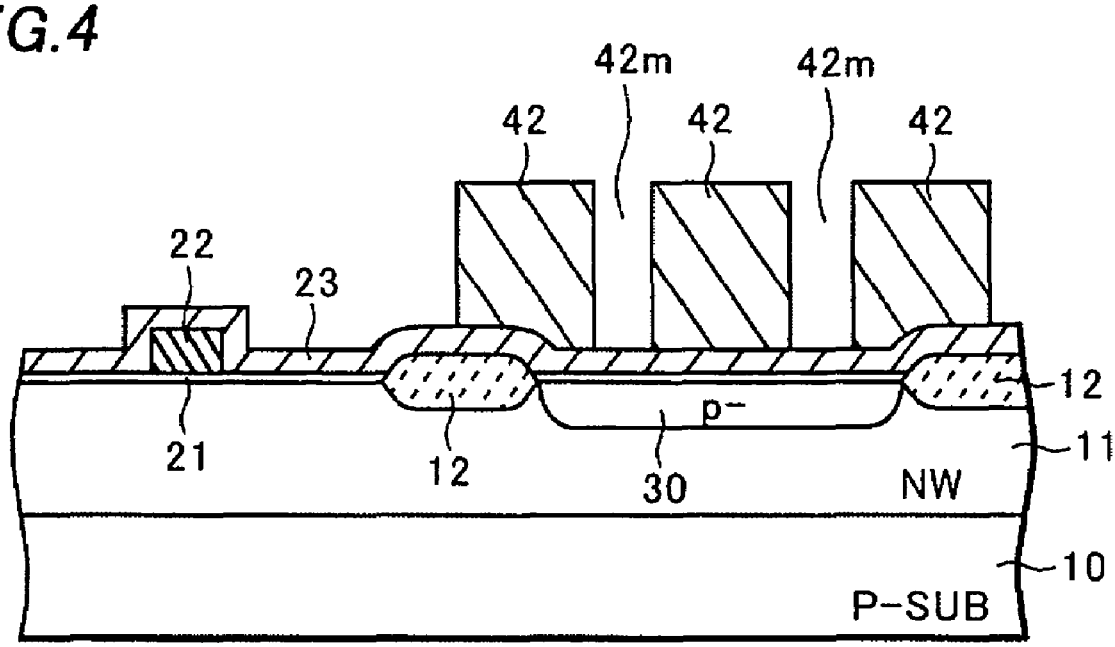
FIG. 4 shows a step after the step of FIG. 3 of the manufacturing method of the semiconductor device of the embodiment of the invention.

Next, as shown in FIG. 4, a second photoresist layer 42 having openings 42$m$ above a part of the diffusion resistance layer 30 is formed on the CVD insulation film 23 by exposure and development with a mask (not shown). The exposed portion of the diffusion resistance layer 30 corresponds to the region to be formed with a contact forming p+ type layer 31 for forming a contact near both ends of the diffusion resistance layer 30.

Figure 5:
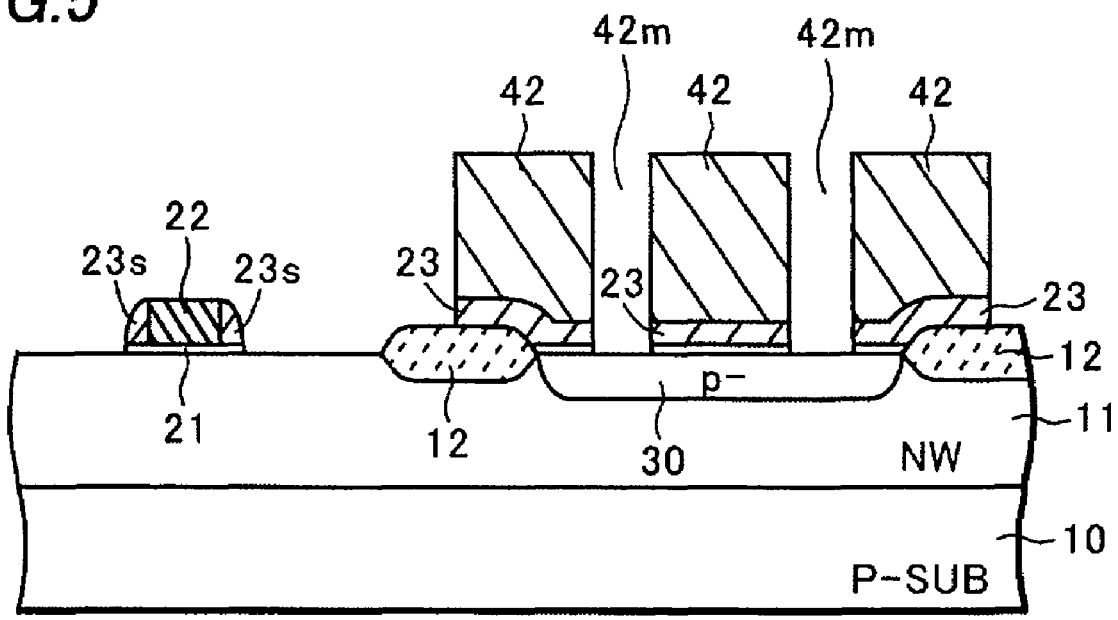
FIG. 5 shows a step after the step of FIG. 4 of the manufacturing method of the semiconductor device of the embodiment of the invention.

Next, as shown in FIG. 5, an anisotropic etching is performed to the CVD insulation film 23 by using the second photoresist layer 42 as a mask. It is preferable that this anisotropic etching is a plasma etching. By performing this anisotropic etching, the gate insulation film 21 and the CVD insulation film 23 formed on a part of the diffusion resistance layer 30 and on a part of the n-type well 11 are removed, and the CVD insulation film 23 on the gate electrode 22 is removed. By this process, a part of the diffusion resistance layer 30 is exposed, and the sidewall spacer 23$s$ is formed on the sidewall of the gate electrode 22.

A main portion of the diffusion resistance layer 30, i.e., the region causing the leak current in the semiconductor device of the related art, is still covered with the CVD insulation film 23. Therefore, even when the CVD insulation film 23 is over-etched, which may be caused for example by an etching time longer than a predetermined time, in the above anisotropic etching, no significant damage occurs in the main portion of the diffusion resistance layer 30 by the over-etching.

Even if damages are given in the exposed part of the diffusion resistance layer 30 where the CVD insulation film 23 is not covered, that is, in the region to be formed with the contact forming p$^+$type layer 31, by over-etching in the anisotropic etching, the damages in that region do not cause a leak current since the contact forming p$^+$-type layer 31 is a layer of high concentration. Therefore, the opening 42$m$, which is formed in the second photoresist layer 42 used as a mask for the anisotropic etching above the part of the diffusion resistance layer 30, does not lead to the increase in the current leakage of the diffusion resistance layer 30 as observed in the device of the related art.

Figure 6:
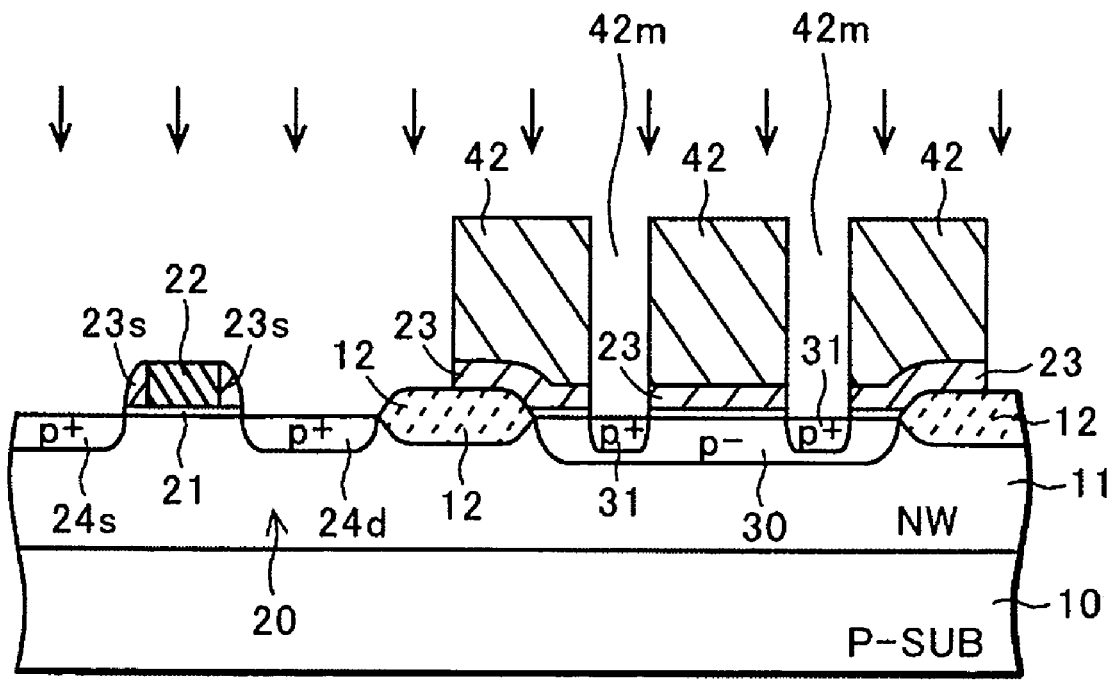
FIG. 6 shows a step after the step of FIG. 5 of the manufacturing method of the semiconductor device of the embodiment of the invention.

Next, as shown in FIG. 6, a p-type impurity of high concentration is doped, i.e., ion-injected, by using the second photoresist layer 42 as a mask. By this process, the contact forming p+-type layer 31 for forming a contact is formed on the diffusion resistance layer 30, and the source layer 24$s$ and the drain layer 24$d$, i.e., p+-type layers of the MOS transistor 20 are formed. It is preferable that the p-type impurity of high concentration is boron difluoride (BF$_2$+) and its acceleration voltage and the doping amount are about 40 KeV and $3\times10^{15}$/cm$^2$, respectively. It is noted that this doping process can be performed without using a mask after the second photoresist layer 42 is removed.

Figure 7:
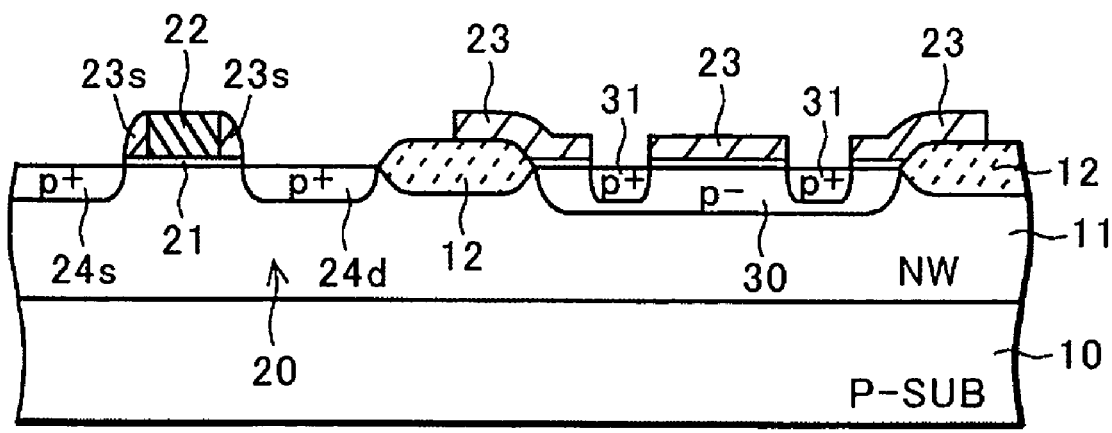
FIG. 7 shows a step after the step of FIG. 6 of the manufacturing method of the semiconductor device of the embodiment of the invention.
Figure 8:
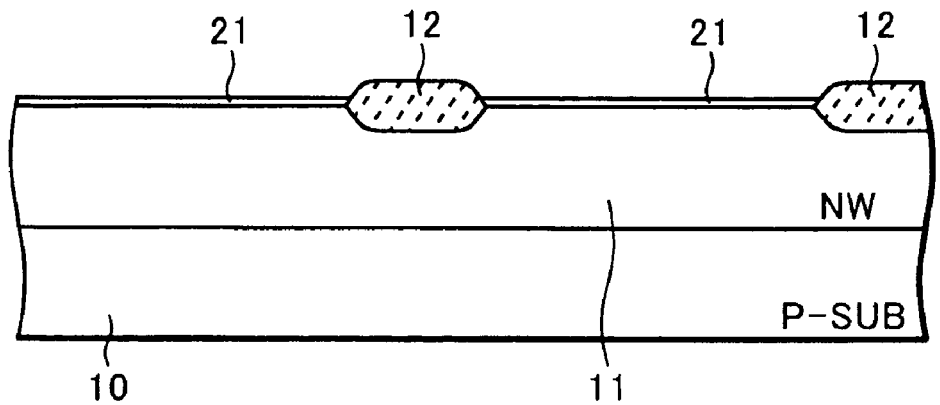
FIGS. 8-12 show a manufacturing method of a semiconductor device according to the related art.
Figure 9:
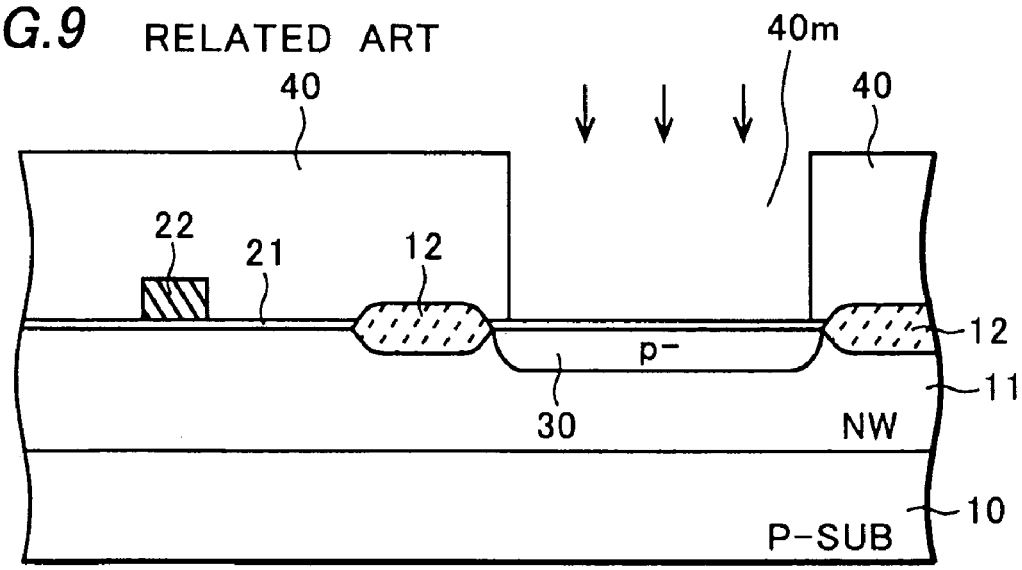
Figure 10:
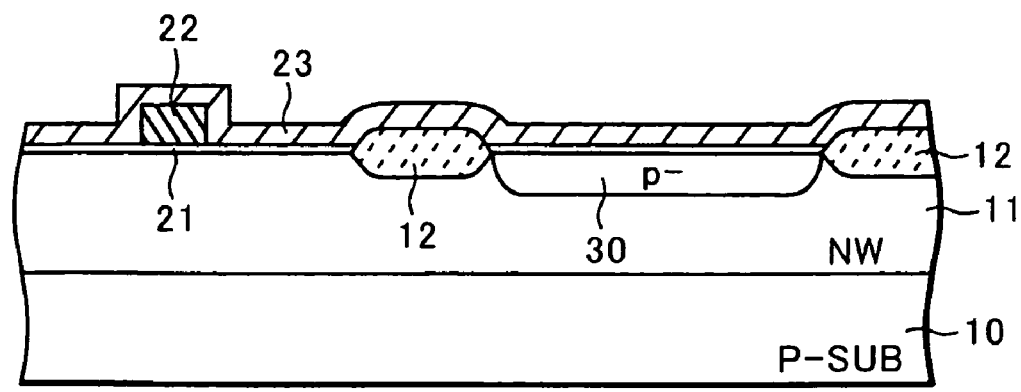
Figure 11:
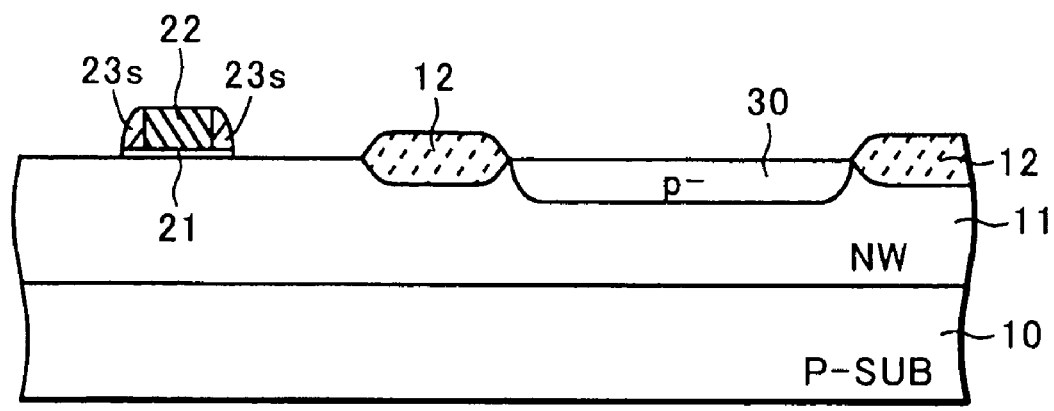
Figure 12:
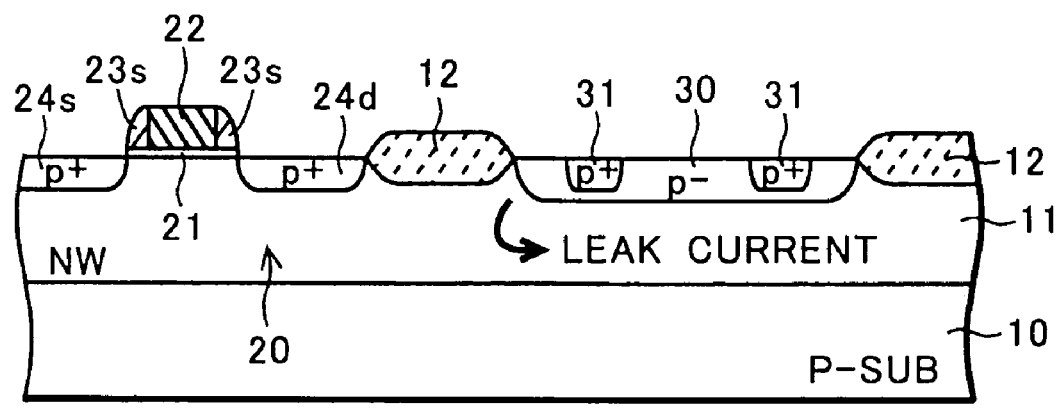

Then, after the second photoresist layer 42 is removed, the MOS transistor 20 and the diffusion resistance layer 30 are completed on the same p-type semiconductor substrate 10 as shown in FIG. 7.

By the manufacturing method of the semiconductor device described above, the main portion of the diffusion resistance layer 30 is not damaged by over-etching. Therefore, even in a high temperature operation, e.g., when high joule heat is generated by a bipolar transistor (not shown) driven with a large current, current leakage observed in the related art can be minimized. This minimizes degrading of the operation characteristics of the semiconductor device caused by the current leakage.

In the embodiment described above, the element separation layer 12, the gate insulation film 21, and the gate electrode 22 are formed to have a thickness of about 500 nm, 120 nm, and 200 nm, respectively. However, the thickness of each layer may vary depending on specific applications of this device.

Furthermore, in this embodiment, the p-type impurity of low concentration for doping is boron (B+), and its acceleration voltage (energy) and injection amount are about 30 KeV and $6 \times 10^{12}/cm^2$, respectively, and the p-type impurity of high concentration is boron difluoride ($BF_2+$), and its acceleration voltage and doping amount are about 40 KeV and $3 \times 10^{15}/cm^2$, respectively. However, the acceleration voltages and the doping amounts may vary depending on specific application of this device.

In this embodiment, the MOS transistor 20 is of a conventional type, and its source layer 24s and drain layer 24d are formed of the p+ type diffusion layer only, but this invention is not limited to this. That is, this invention can be applied to the MOS transistor having a LDD (lightly doped drain) structure where the source layer 24s and the drain layer 24d are formed of the p$^-$-type diffusion layer and the p$^+$-type diffusion layer as long as the sidewall spacer 23s is formed on the sidewall of the gate electrode 22 of the MOS transistor 20.

In this embodiment, the p-type impurity is doped in the n-type well 11 to form the p-channel type MOS transistor 20 and the p$^-$-type diffusion resistance layer 30, but this invention is not limited to this. That is, the n-type impurity is doped in the p-type semiconductor substrate 10 or the p-type well to form an n-channel type MOS transistor and an n$^-$-type diffusion resistance layer.

What is claimed is:

1. A method of manufacturing a semiconductor device comprising a semiconductor substrate of a first conductivity type, comprising:
    forming a well of a second conductivity type in the semiconductor substrate;
    forming an element separation layer and a gate insulation film on the well;
    forming a gate electrode on the gate insulation film and adjacent the element separation layer;
    forming on the well a first photoresist layer having an opening above a portion of the well surrounded by the element separation layer;
    doping a low concentration of impurities of the first conductivity type into the well using the first photoresist layer as a mask so as to form a diffusion resistance layer of the first conductivity type;
    forming an insulation film to cover a top surface and a side wall of the gate electrode and to cover the diffusion resistance layer after removing the first photoresist layer;
    forming on the diffusion resistance layer a second photoresist layer having an opening;
    etching the insulation film and the gate insulation film so that a sidewall spacer is formed on the sidewall of the gate electrode and that a part of the diffusion resistance layer is exposed through the opening of the second photoresist layer; and
    doping a high concentration of impurities of the first conductivity type into the well using the second photoresist layer as a mask so that a source layer and a drain layer are formed adjacent the gate electrode and that a high impurity concentration layer is formed in the diffusion resistance layer.

2. The method of claim 1, further comprising forming a bipolar transistor in the semiconductor substrate.

3. The method of claim 1, wherein the insulation film is formed by a CVD method.

* * * * *